United States Patent [19]

Criscimagna

[11] 3,938,107

[45] Feb. 10, 1976

[54] GAS PANEL WITH IMPROVED CIRCUIT FOR WRITE OPERATION

[75] Inventor: Tony Nick Criscimagna, Woodstock, N.Y.

[73] Assignee: IBM Corporation, Armonk, N.Y.

[22] Filed: July 1, 1974

[21] Appl. No.: 484,835

[52] U.S. Cl. ....................... 340/173 PL; 315/169 TV; 340/324 M

[51] Int. Cl.[2] ........................................ G11C 11/28

[58] Field of Search ........ 340/173 PL; 315/169 TV; 340/324 M

[56] References Cited

UNITED STATES PATENTS 3,851,327 11/1974 Ngo ............................. 340/173 PL

*Primary Examiner*—Terrell W. Fears
*Attorney, Agent, or Firm*—William S. Robertson

[57] ABSTRACT

An improved write circuit for a gas panel produces a sequence of alternating polarity write pulses that are superimposed on a sequence of half cycle pulses of the sustain waveform. Thus the accumulation of charges on the walls of a light-emmitting cell that is required for a write operation is produced by a sequence of write pulses, and each write pulse is lower in amplitude than is required for a single write pulse. The write pulses are progressively shifted ahead in phase to further improve the operation.

6 Claims, 4 Drawing Figures

GAS PANEL WITH IMPROVED CIRCUIT FOR WRITE OPERATION

RELATED APPLICATIONS

Some of the components that will be represented by functional boxes in this specification are described in detail in application Ser. No. 372,384 of T. N. Criscimagna and A. O. Piston filed June 21, 1973.

INTRODUCTION

Although gas panels are well known, it will be helpfhl to review the features and terminology that particularly apply to this invention. In a gas panel, light is emitted from cells that are formed at the cross-over points of two sets of conductors that are mounted on two glass plates positioned in two closely parallel planes so that one set of conductors extends horizontally and the other set extends vertically to form a grid. The conductors are insulated, and when an ionizing voltage is applied between the horizontal conductor and vertical conductor of a cell, the cell ionizes and emits light only briefly as the free charges formed by the ionization migrate to the insulating walls of the cell where the voltage that these charges produce opposes the applied voltage and thereby extinguishes the ionization. An operation to initially establish the charges on the cell wall is called a "write" operation. Once a cell has been written, a continuous sequence of light flashes can be produced by an alternating polarity voltage that is called a "sustain" voltage. The amplitude of the sustain waveform can be made less than the amplitude required to write a previously unwritten cell because the wall charges that remain from a preceding write or sustain operation produce a voltage that adds to the voltage of the sustain waveform to produce an ionizing voltage level at a previously written cell. A previously unwritten (or "erased") cell is not ionized by the sustain waveform. In a gas panel of this type, the sustain waveform is applied across all the horizontal conductors and all of the vertical conductors so that the gas panel maintains a previously written pattern of light emitting cells. The circuits that produce the sustain voltage are called "sustain circuits".

Some ions occur in a cell even in the absence of a voltage on the cell conductors. When a voltage is applied to the cell, the level of ionization increases and some wall charges begin to accumulate. At a particular voltage, ions are created faster than they are lost by recombination and avalanche ionization occurs and appreciable wall charge accumulates. Thus a sustain voltage can not have sufficient amplitude to produce this avalanche ionization in a previously unwritten cell. A write operation, by definition, produces sufficient wall charge that the voltage of the wall charge in combination with the voltage of the next sustain pulse produces a sustain operation.

For a conventional write operation, a suitable voltage pulse is superimposed on the sustain voltage waveform of the same polarity so that the combination of the write pulse and the sustain pulse produces ionization. In order to write an individual cell independently, each of the horizontal and vertical conductors has an individual selection circuit. Thus, applying a sustain waveform across all of the horizontal and vertical conductors but applying a write pulse across only one horizontal conductor and one vertical conductor will produce a write operation in only the one cell at the intersection of the selected horizontal and vertical conductors. An erase operation can be thought of as a write operation that proceeds only far enough to allow the previously charged cell walls to discharge; it is closely similar to the write operation except for timing and amplitude, and the circuits that produce both the write or erase pulses are called "write-erase circuits".

Although the sustain voltage that appears across the horizontal and vertical conductors alternates in polarity, in the gas panel of the cited application, the voltages that are applied to the horizontal and vertical conductors are not made alternately positive and negative with respect to ground; instead they are connected alternately between ground level and a level of positive (arbitrarily) voltage. Thus, considering the vertical conductors as the reference, a positive sustain voltage on the horizontal conductors and ground level on the vertical conductors produces a positive sustain pulse. Conversely, a positive vertical sustain voltage and a ground level horizontal voltage produces a negative sustain pulse which reverses the polarity of the conductors of each cell of the preceding example and reverses the cell wall charge of any cell that has been previously written. This arrangement simplifies the sustain and selection circuits.

Conventional write-erase circuits may produce a positive write pulse on the selected horizontal conductor and a similar pulse of lesser amplitude on each unselected vertical conductor. The positive pulses on the vertical conductors selectively inhibit the write operation that would otherwise take place at each cell along the selected horizontal line. Equivalently, the write-erase circuits may apply a positive pulse of half amplitude to the selected horizontal conductor and a negative pulse of half amplitude to the selected vertical conductor so that the full write voltage appears only at a selected cell. (The unselected horizontal and vertical conductors receive the complementary values.)

The selection circuit usually comprises a transistor switch for each horizontal conductor and each vertical conductor. The horizontal and vertical selection circuits connect the associated conductors to receive the horizontal or vertical sustain waveform and to receive a selected one of the two voltage levels of a write or erase pulse. The selection circuits are commonly addressed in a sequence that produces a scanning operation through the array of light-emitting cells.

SUMMARY OF THE INVENTION

A write voltage is a high amplitude pulse that requires particular voltage capabilities in the transistors of the selection circuits. An object of this invention is to provide a new circuit that produces a write operation with a lower amplitude voltage pulse and with correspondingly reduced voltage requirements for the selection transistors.

According to this invention, a write operation is produced by a sequence of several low amplitude write pulses. These write pulses occur on successive half cycles of the sustain waveform and they have the same polarity as the sustain waveform. The pulses are made high enough in amplitude that ionization occurs and cell wall charge is accumulated. On successive half cycles of the combined sustain and write pulse, additional charge accumulates and over a small number of half cycles the charge level increases to the value required for the sustain operation. However, the amplitude of these pulses is made significantly lower than the amplitude of a conventional singly occurring write pulse. For the positive write pulses, the circuit of this invention operates somewhat similarly to the conventional gas panels that were described in the preceding section. For the negative write operation, means is provided for complementing the selection signals to the horizontal and the vertical selection circuits. For example, a selected horizontal conductor receives a positive write pulse during positive write (as is conventional) and a negative write pulse during negative write. Conversely, a selected vertical conductor receives a negative write pulse during positive write (as is conventional) and receives a positive write pulse during negative write.

As a further feature of this invention, the write pulses are progressively varied in phase. At the beginning of the write operation, the pulses are located toward the trailing edge of the sustain pulse. As the write operation progresses and the charge level on the cell wall increases, the write pulses are shifted ahead to occur earlier in the sustain half cycle. This location of the write pulse is advantageous because the timing of the ionization shifts in this way in the first few cycles of the conventional write operation that is described in the preceding section.

THE DRAWING

THE GAS PANEL OF THE DRAWING

Introduction - Conventional Features

Figure 1:
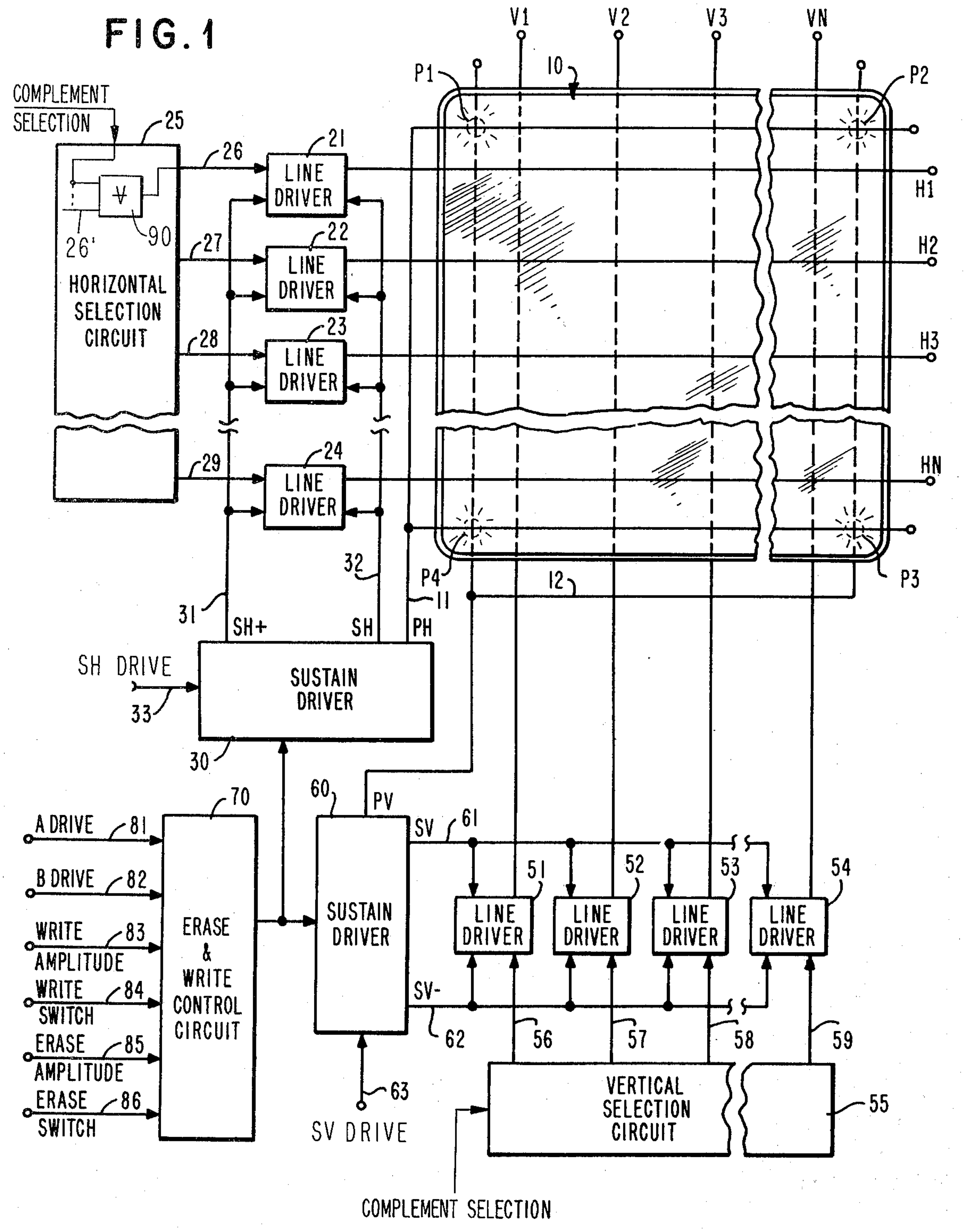
FIG. 1 is a schematic diagram of the display face of a gas panel and the selection and waveform generating circuits of this invention.

FIG. 1 shows the face 10 of a gas panel with representative horizontal conductors Hl – Hn and representative vertical conductors Vl – Vn. Light emitting cells are formed at the crossover points of these conductors. The gas panel also has pilot lights Pl – P4 that are energized by a voltage PH on a conductor 11 and a voltage PV on a conductor 12 to give the cells a suitable level of initial ionization. Each horizontal conductor is connected to a line driver 21 – 24. Each line driver is connected to a horizontal selection circuit 25 to receive selection signals on lines 26 – 29. Each line driver is also connected to a sustain driver 30 to receive a voltage SH+ on a line 31 and a voltage SH on a line 32.

Figure 2:
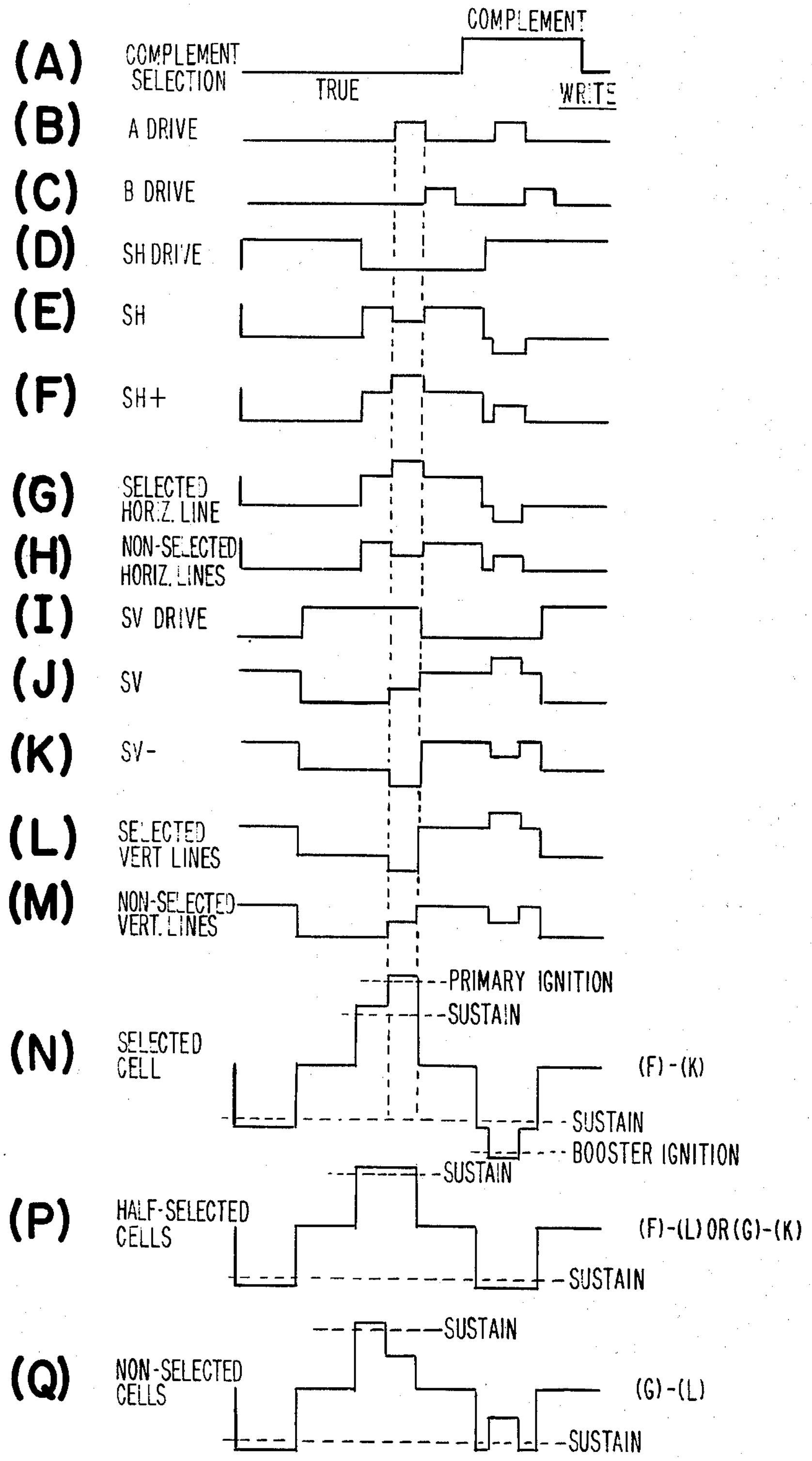
FIG. 2 shows a sequence of waveforms that illustrate the operation of the gas panel of FIG. 1.
Figure 3:
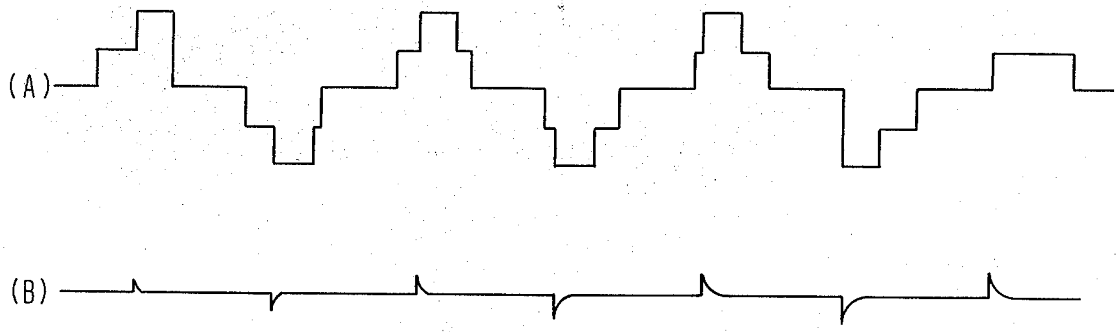
FIG. 3 is a schematic diagram of a timing circuit for the gas panel of FIG. 1.

Sustain driver 30 receives on a line 33 the timing signal SH Drive that is shown in line D of FIG. 2. The sustain driver produces both the sustain waveform and the write and erase pulses on its output lines 31 and 32. As can be seen by comparing lines, D, E, and F in FIG. 2, the outputs SH and SH+ each have a component that is opposite in phase to signal SH Drive on line 33 but is otherwise identical to the signal SH Drive, and these outputs have components associated with the write (and erase) operations that are equal in amplitude and opposite in phase. A line driver 21 – 24 may comprise a transistor switch that turns on and off in response to the signal from horizontal selection circuit 25 to connect a transistor switch that turns on and off in response to the signal from horizontal selection circuit 25 to connect a selected horizontal conductor to receive the voltage SH+ and to connect a non-selected horizontal conductor to receive the voltage SH. The horizontal selection circuit 25 comprises an oscillator, a counter, and a decoder that cooperate in a conventional operation to produce a selection signal on one of the lines 26 – 29 and a non-selection signal on the other of these lines in a sequence that produces a scan. (More complex scanning operations can be produced by these basic components.) A circuit of this general type is shown in FIG. 3.

The corresponding vertical selection and waveform generating components can be readily understood from the preceding description of the horizontal components. Each vertical conductor Vl – Vn is connected to an associated line driver 51 – 54 which is connected to a vertical selection circuit 55 to receive selection signals on lines 56 – 59. A vertical sustain driver 60 produces the vertical components of the sustain waveform and the write and erase pulses. The output SV of sustain driver 60 is connected to the line drivers by means of a line 61 and the signal SV− is connected to the line drivers by means of a line 62. Sustain driver 60 receives a timing signal SV Drive that is shown in Line I of FIG. 2.

An erase and write control circuit 70 controls sustain drivers 30 and 60 according to input signals 81 – 86. Timing signal A Drive on line 81 establishes the rise of the write or erase pulse and timing signal B Drive on line 82 establishes the fall of the write or erase pulse, as lines B and C in FIG. 2 show. The signals Write Amplitude on line 83 establishes the amplitude of the write pulse and the signal Write Switch on line 84 enables this operation. The signal Erase Amplitude on line 85 and the signal Erase Switch on line 86 similarly control the erase operation. Control circuit 70 is identical to the control circuit of Criscimagna and Piston except that the write amplitude is given a lower value for the write operation that will be described later. (The write pulse amplitude is established by the value of resistor 124 in FIG. 2A of Criscimagna and Piston.)

The components that have been described so far are conventional and are described in detail in the cited application of Criscimagna and Piston. This particular circuit illustrates a variety of well known circuits that can be readily modified to operate according to the improved write waveform of this invention.

The Circuit of this Invention - Primary Ignition

Lines N, P, and Q in FIG. 2 show the write waveform of this invention. As is conventional, the sustain component has an amplitude that is designated "sustain" in FIG. 2 and is the value for which each previously written cell will sustain. (The actual value is made slightly higher to avoid operating at a marginal condition.) According to this invention, the write pulse is given an amplitude that is designated "primary ignition". The primary ignition level is less than the level of a conventional write operation, but it is sufficient in combination with a subsequent booster ignition pulse to produce a write operation. (A "write operation" ionizes a cell to the level required for subsequent sustain operations.) The amplitude of the booster ignition pulse may be the same as the amplitude of the primary ignition pulse.

Suppose that a write operation is to take place in the upper right most cell of the gas panel of FIG. 1. The horizontal selection circuit controls line driver 21 to connect its output to receive voltage SH+ from line 31 and controls the other line drivers to connect their output to receive voltage SH from line 32. Thus the waveform SH+ of FIG. 2 line F appears as the waveform on the selected horizontal conductor (FIG. 2 line G) and as a component of the waveform of the selected cell (line N) and of the remaining half selected cells of conductor Hl (line P). Similarly the waveform SH of line F appears on the non-selected conductors (line H in FIG. 2) and as a component of the waveform of cells that are half-selected or non-selected (lines P and Q). The similar operation of the vertical circuit can be understood from FIG. 2, lines J through Q.

At the selected cell, the waveforms of line G and line L combine to produce the positive sustain pulse and positive primary ignition pulse shown in line N. Other cells of horizontal line Hl receive the waveforms of lines G and M and other cells of vertical line VN receive the waveforms of lines H and L; these components have opposing write pulses that cancel and produce only the sustain component across the half selected cells (line P in FIG. 2). The unselected cells receive the waveforms of lines H and M in which the negative write pulses subtract from the sustain pulse, as line Q in FIG. 2 shows. The timing for the sustain and write pulses is selected to assure that the waveform of line Q is suitable for a sustain operation. (Since the write pulse has a reduced amplitude in the circuit of this invention, the positive sustain pulse of line Q is less affected by the write pulses than in a corresponding conventional circuit.) The circuits and operation that have been described so far in connection with the positive sustain pulse and the primary ignition pulse are conventional except that the write amplitude signal on line 83 in FIG. 1 is set to establish a lower amplitude than is conventional for a write pulse.

The Circuit of This Invention - Booster Ignition

As line N of FIG. 2 shows, the circuit of this invention produces a negative booster ignition pulse on the next sustain pulse. For this operation, the circuit of FIG. 1 includes means for generating the timing signal Complement Selection which is shown in line A of FIG. 2 and includes means for complementing the selection signals on lines 26 – 29 and 51 – 54 in response to this signal. As line A of FIG. 2 shows, the signal Complement Selection has a zero logic level during the positive sustain pulses when the selection lines are to receive their conventional or true values and it has a one logic level during the negative sustain pulses when the selection lines are to have complement values. The complementing operation is logically an Exclusive OR operation. A representative Exclusive OR circuit 90 is connected to to receive the signal Complement Selection and to receive the signal 26' that is conventionally formed in the selection circuit. As the dashed line for the complement selection signal indicates, each line driver has an individual Exclusive OR circuit that receives the signal Complement Selection at one of its inputs. Thus, when the signal Complement Selection has a zero logic level value the selection line 26 has a logical value of the signal on the line 26', and when the signal Complement Selection has a one logic level value, the signal on line 26 is a complement of the signal on line 26'.

The operation of the negative write pulse can be understood from waveforms of FIG. 2. Line N shows the booster ignition negative write pulse superimposed on the negative sustain pulse. By the operation of inverting the signals from the selection circuits, line driver 21 connects its output Hl to receive voltage SH. Notice that waveform SH (FIG. 2 line E) has negative write pulses for both the positive and negative sustain operation but that the selected horizontal conductor (line G) receives the positive write pulse of FIG. 2 line F for a positive write and the negative pulse of line E for a negative write. Similarly, selected vertical line VN receives the positive write pulse of FIG. 2 line K, as shown in line L. Thus, the negative write pulse is formed by circuits and conventional line drivers that otherwise produce only a positive write pulse.

In the half selected cells of conductor Hl, the negative write pulse of line G opposes the negative write pulse of line M, and in the half selected cells of conductor VN the positive write pulse of line H opposes the positive write pulse of line L, as line P of FIG. 2 shows. In the non-selected cells, the negative write pulses of lines G and L combine and form a positive pulse that subtracts from the negative sustain pulse. The resulting negative sustain pulse has the amplitude of a conventional sustain pulse but, depending on the timing of the write booster ignition pulse, the sustain waveform has either a single narrowed pulse of the general waveform of the positive sustain pulse in line Q or, as the drawing shows, the negative sustain waveform has a first and a second narrow sustain pulse; this waveform nevertheless provides a satisfactory sustain operation.

At the end of the primary ignition pulse, the selected cell has a charge accumulation that is insufficient for ionization in response to a negative sustain pulse but is sufficient to produce the ionization of a normal write operation in response to the combination of the negative sustain pulse and the negative booster ignition pulse. The booster ignition pulse preferably has the amplitude of the primary ignition pulse, but it may be advanced in phase, as line P of FIG. 2 shows.

The selected phase of the booster ignition pulse of FIG. 2 line N can be understood from the operation of conventional write and sustain pulses. A conventional write pulse may not produce the value of wall charges that is produced by a sustain operation, but it produces enough wall charge that the next sustain operation will take place. Typically the wall charge builds up to a steady state value during the first few half cycles after a write operation. In such an operation, the avalanche ionization takes place at a successively earlier point in the sustain cycle as the wall charge increases until in the steady state operation the ionization takes place on the rise of the sustain pulse (there are some fixed time delays associated with the ionization process). Thus the phase of the negative write pulse in line N of FIG. 2 represent an optimum timing point when the cell has increased its level of ionization in response to the preceding portion of the sustain waveform and the previously accumulated wall charge.

Figure 4:
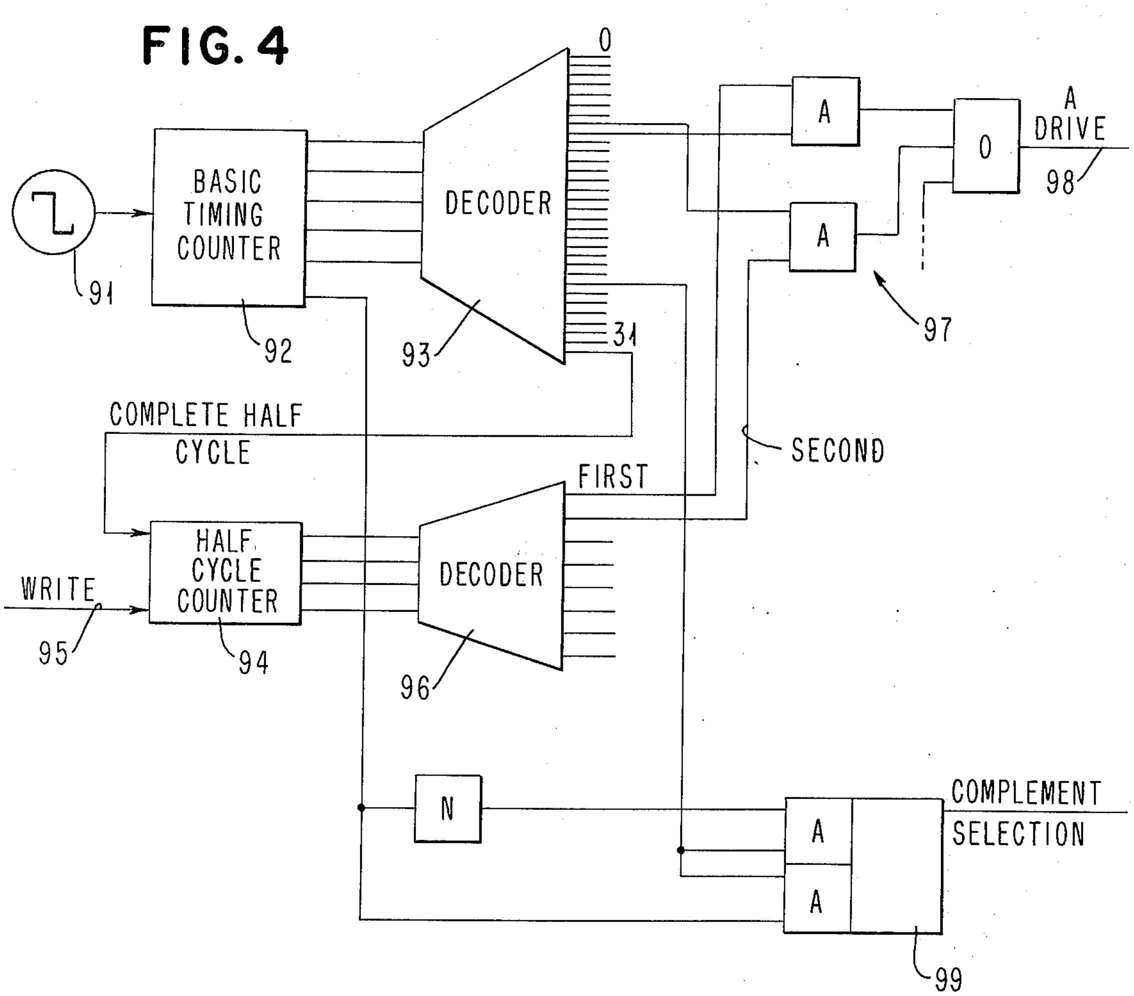
FIG. 4 shows two waveforms of a second method of operating the gas panel of FIG. 1.

The Gas Panel and Operation of FIGS. 3 and 4

As will be explained next the gas panel may have a primary ignition pulse of further reduced amplitude followed by several booster ignition pulses. FIG. 3 shows a positive sustain pulse and a coincident primary positive write pulse followed by negative and positive booster ignition write pulses that are superimposed on sustain pulses of the same polarity. The sequence continues for several half cycles with the positive and negative write pulses advanced in phase on successive half cycles until the write pulse occurs at the leading edge of the sustain pulse. This operation produces the wall charge accumulation of a conventional write operation and thereafter the sustain pulse continues without the write pulse until the next write or erase operation. Line B in FIG. 3 shows the current that is applied to the horizontal and vertical conductors of the selected cell. (The waveform is essentially a conventional capacitive charging current waveform.) A write pulse has sufficient amplitude to produce at least some additional wall charge for the next sustain and write pulses. As the current waveform of line B of FIG. 3 shows, the charge builds up on successive half cycles until it reaches the value of a conventional sustain operation.

The circuits for timing the phase of the write pulse are easily provided by modifying the conventional timing circuit of a gas panel. FIG. 4 shows circuits of this general type. An oscillator 91 provides timing pulses that are a convenient multiple of the frequency of the sustain waveform. A counter 92 responds to these pulses to produce outputs that identify subintervals in the sustain half cycle in binary form and a decoder 93 is connected to the output of the decoder to produce a one logic level signal on an individual output line for each timing interval. The illustrated counter has five outputs that produce the binary counting sequence 0 through decimal 31, and 32 outputs designated 0 through 31 that successively carry a one logic level signal identifying the corresponding timing subinterval of a half cycle of the sustain waveform. An additional output from the next higher order position of counter 92 provides timing for a full cycle and a latch 99 is connected to produce the timing signal Complement Selection of FIGS. 1 and 2.

FIG. 4 also shows an analogous half cycle counter 94 that receives a signal from decoder 93 that identifies a reference point in the sustain half cycle. The half cycle counter is turned on in response to the signal Write on line 95 which identifies that the next few half cycles will be used for the write operation. A decoder 96 responds to the output of the half cycle counter to produce outputs identifying the first and subsequent half cycles in a write operation. Representative logic components 97 are shown in the drawing for producing a write timing pulse on a line 98 at two different points on successive half cycles. This logic is extended for subsequent half cycles for the operation of FIG. 3.

From the preceding description and from the extensive prior development of a variety of gas panel designs to which this invention readily applies, those skilled in the art will recognize appropriate modifications to these specific gas panels within the scope of the claims.

The claims are:

1. In a gas panel of the type having light emitting cells formed at crossover points of horizontal and vertical conductors and means for producing an alternating polarity sustain waveform across the conductors for each cell, the improvement comprising, means for producing opposite polarity write pulses of an amplitude and width to establish a value of wall charge accumulation that is less than the value required for a write operation, and means for applying said write pulses to the horizontal and vertical conductors of a selected cell in the polarity of the sustain waveform for a plurality of sequential sustain half cycles to produce a write operation.

2. The gas panel of claim 1 including selection circuit means producing binary selection signals identifying selected and unselected horizontal and vertical conductors and wherein said means for applying said write pulses to said cells includes, means responsive to said selection signals for applying a write pulse of the sustain polarity to the selected horizontal and vertical conductors and write pulses of the opposite polarity to the non-selected conductors, and means for complementing said selection signals during sustain half cycles of one polarity for a write operation.

3. The gas panel of claim 2 including means for advancing the phase of the write pulses on successive half cycles of a write operation.

4. The gas panel of claim 3 including means for advancing the phase of the write pulses from approximately the trailing edges of a half cycle of the sustain waveform to about the leading edge of a half cycle of the sustain waveform.

5. The gas panel of claim 4 including means to provide said write pulses over six or fewer half cycles of the sustain waveform write pulse amplitude is a minimum value for said write operation.

6. The gas panel of claim 4 including means to provide said write pulses on two consecutive half cylces.

* * * * *